United States Patent [19]
Cheng et al.

[11] Patent Number: 5,834,815
[45] Date of Patent: Nov. 10, 1998

[54] LAYOUT STRUCTURE FOR IMPROVING RESISTANCE UNIFORMITY OF A POLYSILICON RESISTOR

[75] Inventors: Shen-Wen Cheng, Tainan; Chun-Lin Cheng, Taipei, both of Taiwan

[73] Assignee: Vanguard International Semiconductor Corporation, Hsinchu, Taiwan

[21] Appl. No.: 686,135

[22] Filed: Jul. 23, 1996

[51] Int. Cl.[6] ................................................... H01L 27/11
[52] U.S. Cl. ............................................ 257/379; 257/904
[58] Field of Search ................................. 257/904, 379

[56] References Cited

U.S. PATENT DOCUMENTS

| | | | |
|---|---|---|---|
| 5,610,856 | 3/1997 | Yoshizumi et al. | 257/904 |
| 5,625,215 | 4/1997 | Chen et al. | 257/904 |

FOREIGN PATENT DOCUMENTS

| | | | |
|---|---|---|---|
| 1-11362 | 1/1989 | Japan | 257/904 |
| 1-194347 | 8/1989 | Japan | 257/904 |

*Primary Examiner*—Mark V. Prenty
*Attorney, Agent, or Firm*—Christensen, O'Connor, Johnson & Kindness PLLC

[57] ABSTRACT

A layout structure for improving a polysilicon load resistor which has a uniform high resistance is disclosed. A polysilicon film is used as the high resistance load element so that the film has a relatively high resistance. However, the resistance of these resistors often varies. This variation can be up to two orders of magnitude. The non-uniform resistance is caused by hydrogen penetration into the polysilicon resistor. The solution of the present is to layout the SRAM cell so that the polysilicon resistor is completely covered by one of these subsequent layers. In the present invention, the polysilicon resistor is partially covered by different layers, such as a subsequent metal layer or polysilicon layer.

4 Claims, 6 Drawing Sheets

LAYOUT STRUCTURE FOR IMPROVING RESISTANCE UNIFORMITY OF A POLYSILICON RESISTOR

FIELD OF THE INVENTION

The present invention relates to semiconductor integrated circuit fabrication and, more particularly, to methods of fabricating a polysilicon resistor. Still more particularly, this invention relates to methods of laying out a different layers of an integrated circuit device in fabricating a polysilicon resistor.

BACKGROUND

Static random access memories (SRAMs) are widely used in many applications. One reason for the popularity of SRAMs is that they do not require periodic refresh signals in order to retain their stored data, unlike dynamic random access memories (DRAMs). Typically, the bit state of a SRAM memory cell is stored in a flip-flop, commonly implemented with a pair of cross-coupled inverters. As is well known in the art of digital circuits, a flip-flop is capable of storing a bit, i.e., the output state of a flip-flop circuit is stable at only one of two possible logic states.

FIG. 1 is a schematic diagram of a conventional SRAM memory cell 1. As shown in FIG. 1, the SRAM memory cell 1 includes a flip-flop implement with a pair of inverter circuits. The inverters are formed by metal oxide semiconductor field effect transistors (MOSFETs) $T_1$ and $T_2$ and high resistance load resistors $R_1$ and $R_2$. The first inverter circuit is formed by MOSFET $T_1$ and resistor $R_1$, with the resistor $R_1$ connected in series between the drain of the MOSFET $T_1$ a supply voltage source Vcc. The source of the MOSFET $T_1$ is connected to a ground potential source Vss. Likewise, the second inverter is formed by MOSFET $T_2$ and resistor $R_2$ similarly connected between the supply voltage source Vcc and the ground potential source Vss. The gate of each inverter's MOSFET is connected to the output node of the other inverter, i.e., the node where the resistor is connected to the drain of the MOSFET.

The memory cell 1 also includes two transfer MOSFETs $T_3$ and $T_4$. Each transfer MOSFET has its channel connected between the output node of an inverter and a data line and its gate connected to a word line. More specifically, MOSFET $T_3$ has its channel connected to a data line $DL_1$ and the output node of the first inverter. The gate of MOSFET $T_3$ is connected to a word line WL. Similarly, the MOSFET $T_4$ has its channel connected between a data line $DL_2$ and the output node of the second inverter and its gate connected to the word line WL. In a typical SRAM, the data lines $DL_1$ and $DL_2$ carry a differential signal to and from the SRAM memory cell 1. The operation of the SRAM memory cell 1 is well known in the art of SRAMs and need not be described in detail.

The resistors $R_1$ and $R_2$ serve as load devices in the inverters of the SRAM cell. In order to minimize power consumption and yet maintain an optimum soft error rate, high valued load resistors are used to obtain small load current. For example, a resistance in the range of about 10–100 giga-ohms is often used. Typically, the resistors $R_1$ and $R_2$ are implemented with a doped polysilicon film. However, the resistance of these polysilicon resistors often varies in conventional SRAM memory cell fabrication. This variation can be up to two orders of magnitude. It is thought that the non-uniform resistance is caused by hydrogen penetration in the polysilicon. The conventional solution to this problem is to cap the polysilicon resistor with a nitride layer or "cap" to prevent the hydrogen penetration. Of course, forming the nitride cap undesirably increases the complexity of the manufacturing process.

SUMMARY

In accordance with the present invention, a method of fabricating a polysilicon resistor having a resistance with improved uniformity in resistance is provided. In one embodiment, the layout of the circuit containing the polysilicon resistor is designed so that a suitable layer already required for implementing the circuit is formed to completely cover the polysilicon resistor. Consequently, this layer serves as a cap to prevent hydrogen penetration into the polysilicon resistor. Therefore a polysilicon resistor according to this embodiment of the present invention does not require a special dedicated cap to prevent hydrogen penetration. In one embodiment, a metal layer is formed on and completely covering the polysilicon resistor. In another embodiment, a subsequent polysilicon layer is formed on and completely covering the polysilicon resistor. In yet another embodiment, a combination of a metal layer and a subsequent polysilicon layer is used to completely cover the polysilicon resistor.

In embodiments adapted for fabricating polysilicon load resistors in a SRAM cell, some of the structures (e.g., metal and/or polysilicon interconnect) used in implementing the SRAM cell is used as a cap, unlike the special dedicated nitride cap required in typical conventional SRAM fabrication processes. In one embodiment, a metal layer which is acted as bit line is patterned to completely cover the polysilicon resistor, thereby forming a cap that substantially prevent hydrogen penetration into the polysilicon resistor. With this implement, the polysilicon load resistor has substantially uniform resistance across the wafer without using a special dedicated nitride layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
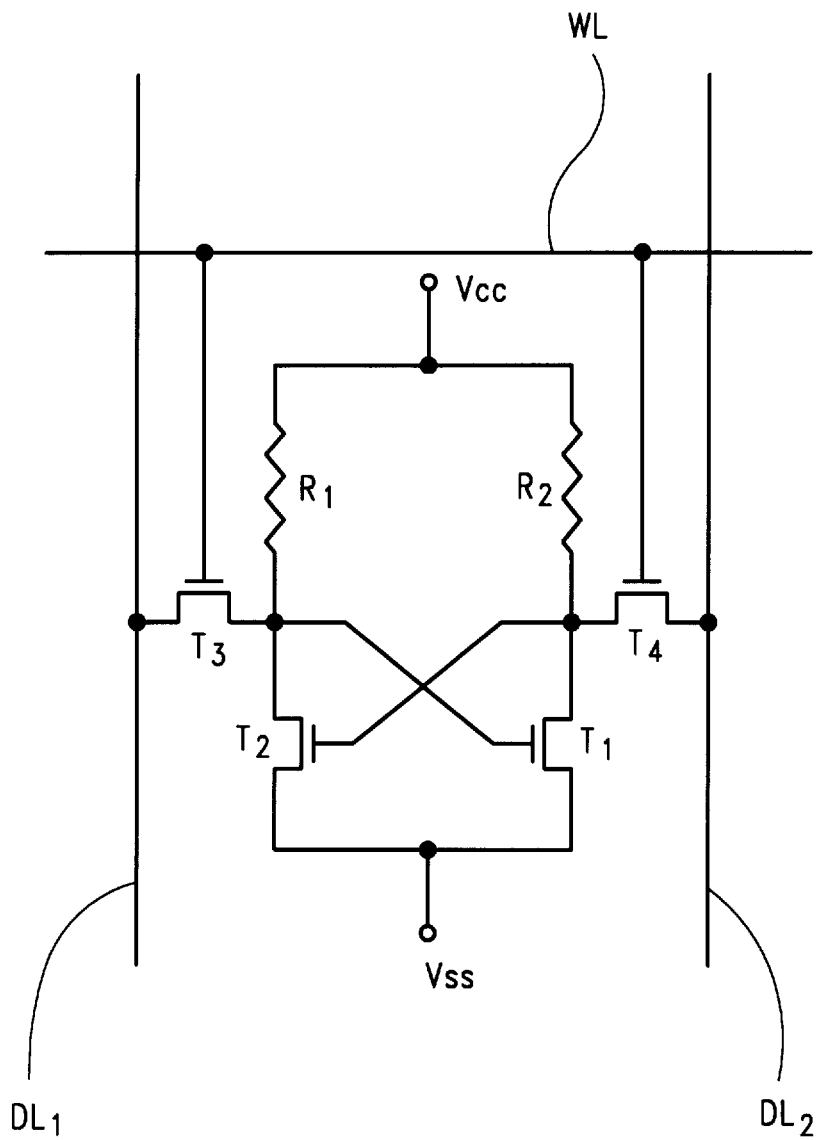
FIG. 1 is a schematic diagram illustrating a typical SRAM memory cell.

A polysilicon film used as a high resistance load element for a SRAM memory cell similar to the memory cell illustrated in FIG. 1. However, the resistance of these polysilicon resistors often varies because of non-uniform hydrogen penetration into the polysilicon load resistor. The hydrogen effect is majorenhanced by hydrogen diffusion from the intermetal dielectric layer (IMD) through the polysilicon load resistor in conventional SRAM memory cell layouts.

Figure 2A:
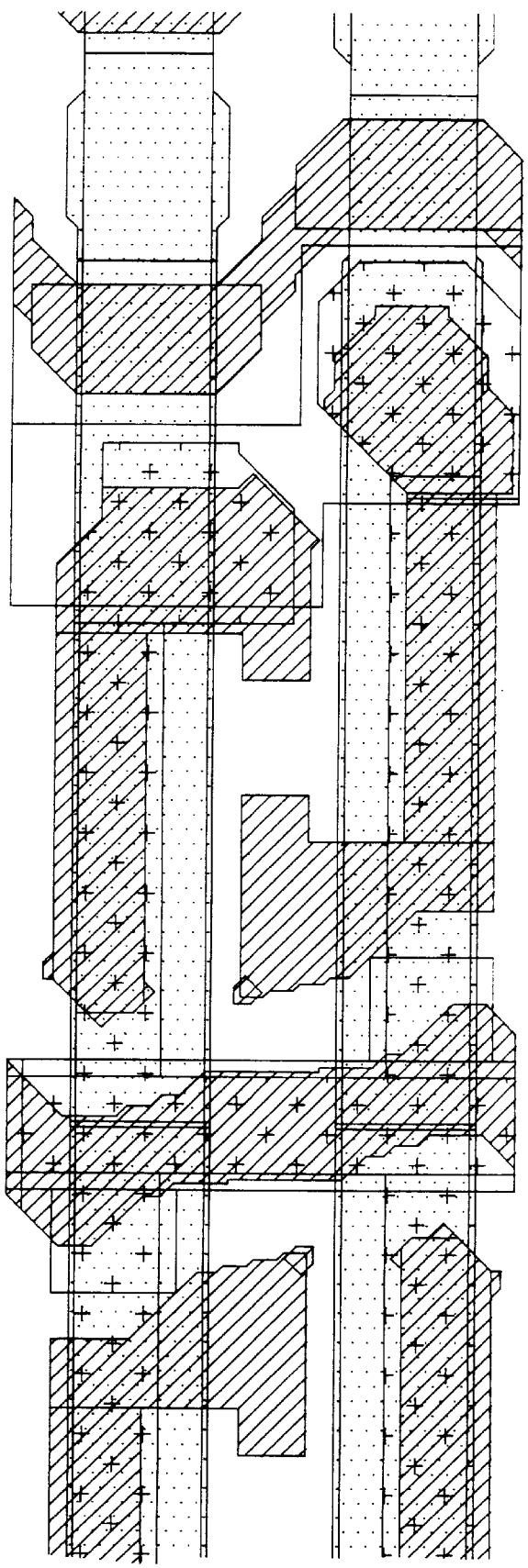
FIG. 2A is a diagram illustrating an actual layout structure of one embodiment of the present invention.

FIG. 2A shows a SRAM memory cell array layout according to one embodiment of the present invention. A polysilicon layer $P_1$ is patterned to form gates for transistors in the SRAM memory cells. The polysilicon load resistors (corresponding to the resistors $R_1$ and $R_2$ in FIG. 2A) are formed in the polysilicon layer $P_2$. The metal layer $M_1$ is patterned into long substantially parallel strips, which is acted as bit line. Forming interconnect structures for implementing said SRAM memory cell. As is shown in FIG. 2A, the metal layer $M_1$ completely cover the polysilicon load resistor. Thus, the metal layer $M_1$ is used to form a cap over the polysilicon load resistors, thereby eliminating the need to form a special dedicated nitride cap as required in conventional SRAM memory cell fabrication. Although FIG. 2A shows a particular layout scheme for implementing a SRAM memory cell so that the polysilicon load resistor is capped by the metal layer $M_1$, those skilled in the art of SRAM fabrication can, in light of the present disclosure, form without undue experimentation different SRAM memory cell layouts that completely cover the polysilicon load resistors with a metal layer.

Figure 2B:
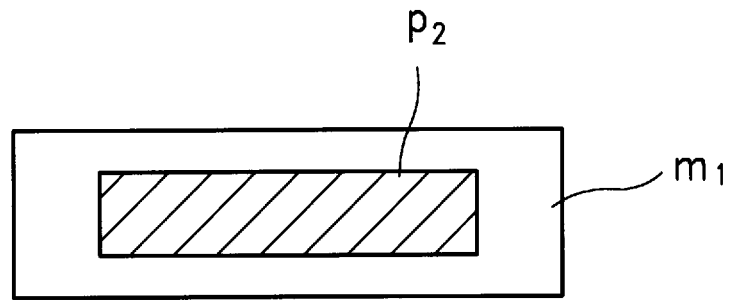
FIG. 2B is a simplified diagram illustrating a simplified layout structure according to one embodiment of the present invention.

FIG. 2B shows a unit pattern of a polysilicon resistor illustrating how the polysilicon resistor is capped in the embodiment depicted in FIG. 2A. The polysilicon resistor is formed from the polysilicon layer $P_2$. The metal layer $M_1$ is then deposited atop the polysilicon load resistor so that every unit area of the polysilicon load resistor is completely covered by the metal layer $M_1$. Thus hydrogen penetration into the polysilicon load resistor is substantially eliminated.

Figure 3:
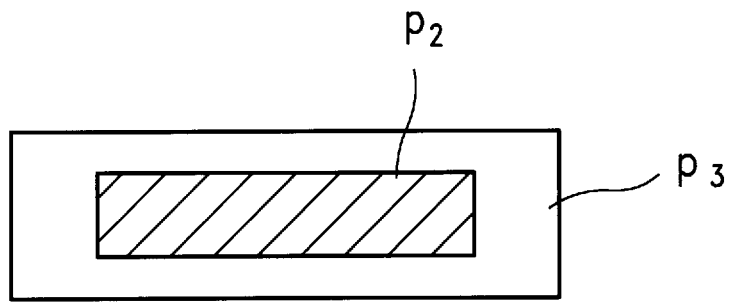
FIG. 3 is a simplified diagram illustrating a layout structure according to a second embodiment of the present invention.

FIG. 3 shows a unit pattern of a polysilicon resistor illustrating how a polysilicon resistor is capped according to another embodiment of the present invention. The polysilicon resistor is formed from a polysilicon layer $P_2$. Then a subsequently formed polysilicon layer $P_3$ is deposited so as to completely cover the polysilicon resistor. This embodiment is used advantageously in SRAM memory cells having polysilicon interconnects to connect various devices and structures within the SRAM memory cell. Thus, by laying out the memory cell so that a required structure formed from the polysilicon layer $P_3$ completely covers the polysilicon load resistor without additional capping layer to prevent hydrogen penetration into the polysilicon load resistor.

Figure 4:
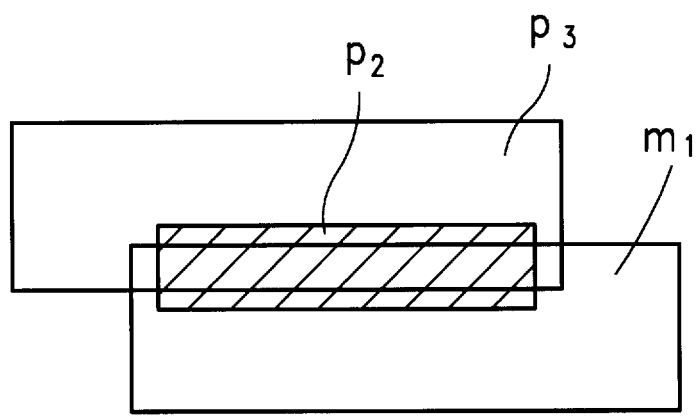
FIG. 4 is a simplified diagram illustrating a layout structure according to a third embodiment of the present invention.

FIG. 4 shows a unit pattern of a polysilicon resistor illustrating how a polysilicon resistor is capped according to yet another embodiment of the present invention. In this embodiment, a combination of the metal layer $M_1$ and the polysilicon layer $P_3$ are used to completely cap the polysilicon load resistor formed from polysilicon layer $P_2$. The metal layer $M_1$ is used for bit line and the polysilicon layer $P_3$ is used for interconnection.

Figure 5:
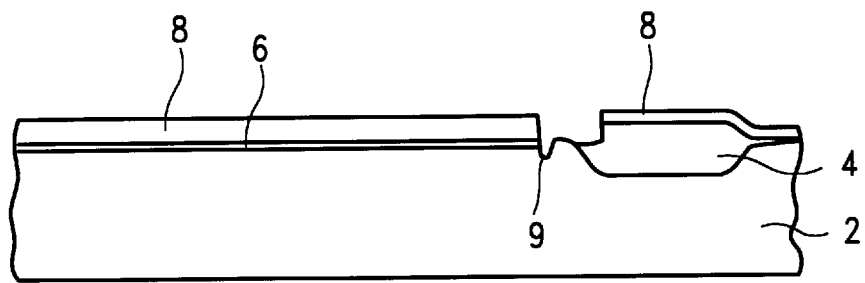
FIG. 5 is a cross sectional representation of a semiconductor wafer illustrating the step of forming a silicon dioxide layer, a first polysilicon layer and buried contact in accordance with one embodiment of the invention.

FIG. 5 is a cross-sectional view illustrating an early stage in forming a polysilicon resistor for a SRAM memory cell, according to one embodiment of the present invention. A single crystal silicon substrate 2 which has a <100> crystallographic orientation is provided. The substrate 2 may have source/drain impurity regions formed therein. The source/drain impurity regions can be formed using standard processes well known in the art of SRAM fabrication. A thick field oxide (FOX) region 4 is formed to provide isolation between devices on the substrate 2. The FOX region 4 is created in a conventional manner. For example, the FOX region 4 can be formed via photolithography and dry etching steps to etch a silicon nitride-silicon dioxide composition layer. After the photoresist is removed and wet cleaned, a thermal oxidation in an oxygen steam ambient is used to grow the FOX region 4 to a thickness about 4000–6000 angstroms.

Before forming the FOX region 4, a silicon dioxide layer 6 is created on the top surface of the substrate 2 to serve as the gate oxide for subsequently formed MOSFETs. The term MOSFET is used herein to also refer to silicon gate technologies. In one embodiment, the silicon dioxide layer 6 is formed by using an oxygen-steam ambient, at a temperature of about 800°–900° C. Alternatively, the oxide layer 6 may be formed using any suitable oxide chemical compositions and procedures. In this embodiment, the thickness of the silicon dioxide layer 6 is approximately 100 angstroms.

A doped first polysilicon layer 8 is then formed over the FOX region 4 and the silicon dioxide layer 6 using a low pressure chemical vapor deposition (LPCVD) process. In this embodiment, the first polysilicon layer 8 has a thickness of about 500 angstroms. Next, standard photolithography and dry etching steps are used to form a buried contact region 9 and, as shown in FIG. 2, to expose a portion of the FOX region 4 proximate to the buried contact region 9. The use of buried contacts in semiconductor process provides an important benefit in that it makes available an additional level of interconnect on the integrated circuit.

Figure 6:
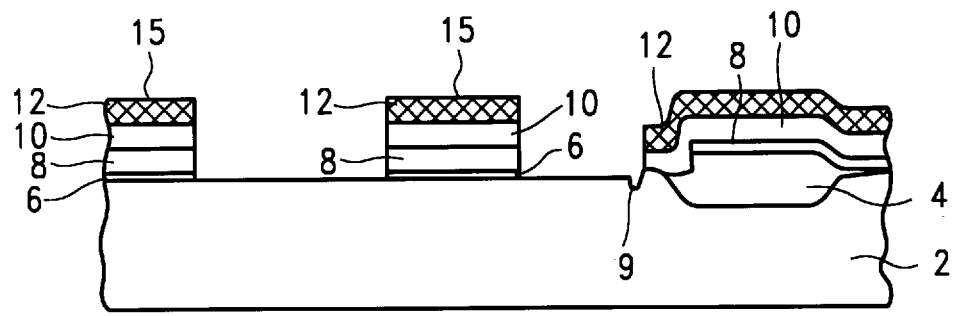
FIG. 6 is a cross sectional representation of a semiconductor wafer illustrating the step of forming a gate structure in accordance with one embodiment of the invention

FIG. 6 illustrates a next stage in fabricating the SRAM memory cell. An undoped second polysilicon layer 10 is then formed by LPCVD on the exposed portions of the substrate 2, the silicon dioxide layer 6 and the FOX region 4. Subsequently, the second polysilicon layer 10 is doped with phosphorus using any suitable method. In this embodiment, the polysilicon layer 10 is doped by ion implantation with a dosage of about 5E13–5E16 atoms/cm$^2$ with an energy of about 30–50 KeV. The thickness of the first polysilicon layer 10 is about 1000 angstroms. A tungsten silicide layer 12 is then formed on the polysilicon layer 10. In this embodiment, a conventional CVD process is used to form the tungsten silicide (WSi$_x$) layer 12 to a thickness of about 1000–1500 angstroms by reacting tungsten fluoride (WF$_6$) with silane (SiH$_4$). Standard photolithography and etching processes are performed to etch the silicon dioxide layer 6, the first polysilicon layer 8, the second polysilicon layer 10 and the tungsten silicide layer 12 to define gate structures 15 aligned with the aforementioned source/drain impurity regions for two MOSFETs. In this embodiment, these two MOSFETs form one half a conventional four transistor SRAM memory cell. Thus, one MOSFET corresponds to MOSFET T1 (FIG. 1) and the other corresponds to MOSFET T2 (FIG. 1). The other half of the SRAM memory cell is formed in a similar manner and, accordingly, need not be shown In addition, as shown in FIG. 6, the segment of the second polysilicon layer 10 remaining above the FOX region 4 (after the photolithography and etching processes) contacts the substrate 2 near the buried contact region 9.

Figure 7:
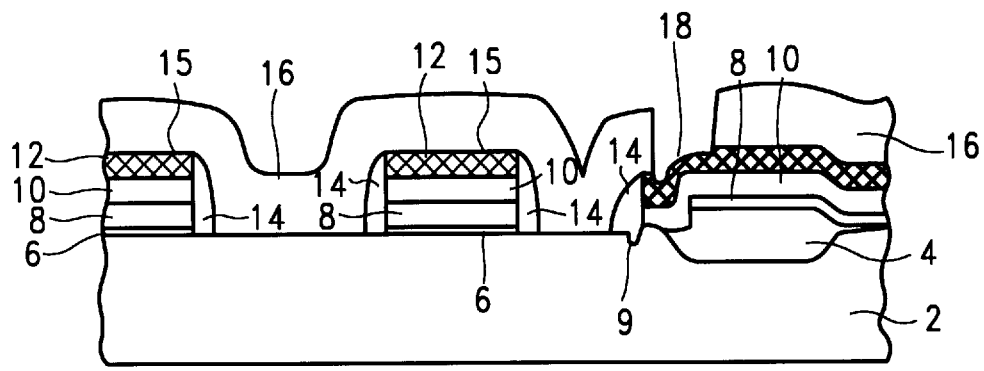
FIG. 7 is a cross sectional representation of a semiconductor wafer illustrating the step of forming a contact hole in accordance with one embodiment of the invention.

Referring to FIG. 7, a first tetraethylorthosilicate (TEOS) layer is formed on the gate structure and the substrate 2. The thickness of the first TEOS layer is about 1000–2000 angstroms. An anisotropic etching is then performed to etch the first TEOS layer to form side wall spacers 14 around the gate structures 15 and in the buried contact region 9. A second TEOS layer 16 is then deposited to have a thickness of about 1000–2000 angstroms. Photolithography and etching processes are then performed to etch the second TEOS layer 16 to form a contact hole 18 and expose a portion of the silicide layer 12 on the top of the second polysilicon layer 10 above the FOX region 4.

Figure 8:
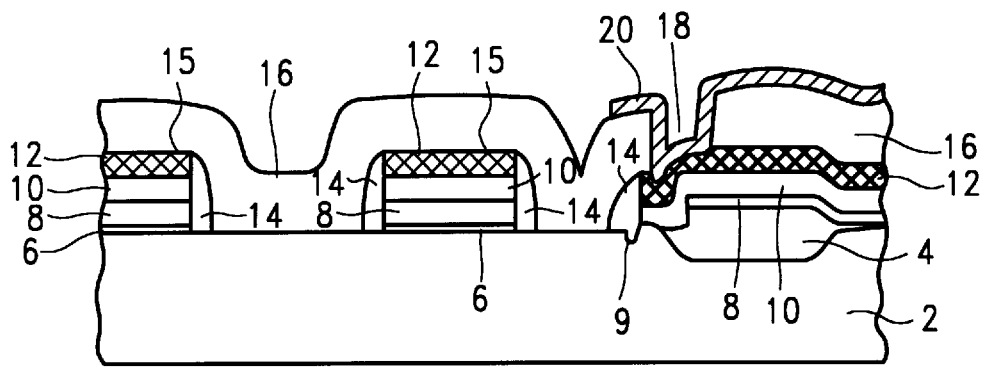
FIG. 8 is a cross sectional representation of a semiconductor wafer illustrating the step of forming a third polysilicon layer in accordance with one embodiment of the invention.

Referring to FIG. 8, a third polysilicon layer is conformally formed over the second TEOS layer 16, the tungsten silicide layer 12 and along the surface of the contact hole 18. In this embodiment, the third polysilicon layer is formed by LPCVD and serves as the polysilicon load resistor for the SRAM memory cell. The thickness of the third polysilicon layer is 500–600 angstroms. In order to minimize power consumption and maintain an optimum soft error rate, very high valued load resistor must be used to abtain small load current. In one embodiment, the third polysilicon layer 20 is doped with arsenic. Alternatively, phosphorus can be used as the dopant. The dosage of the impurities is between 5E13–8E13 atoms/cm$^2$. The energy of the implantation is about 30–50 KeV. Subsequently, a photoresist is pattern for Vcc implantation. In this embodiment, the energy of the implantation is about 30–50 KeV and the dosage of the impurities is between 1E15–5E15 atoms/cm$^2$. Photolithography and etching processes are performed to etch the third polysilicon layer, thereby defining a polysilicon resistor 20.

Figure 9:
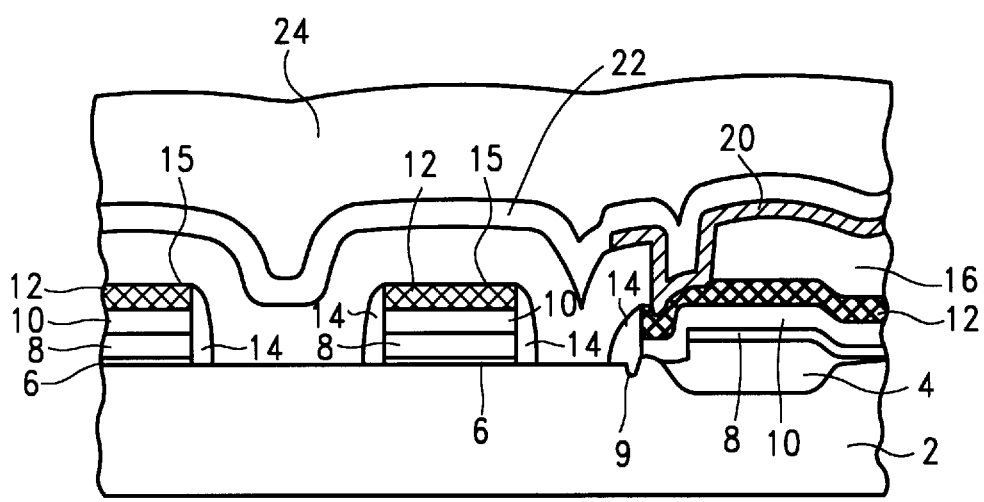
FIG. 9 is a cross sectional representation of a semiconductor wafer illustrating the step of forming a third dielectric layer and fourth dielectric layer in accordance with one embodiment of the invention.

Referring to FIG. 9, a third TEOS layer 22 is deposited over the structure of FIG. 8. In this embodiment, the third TEOS layer 22 has a thickness of about 1000–2000 angstroms. A dielectric layer 24 is then formed on the third TEOS layer 22. The thickness of the dielectric layer 24 is about 4500 angstroms. Any suitable material can be used to form the dielectric layer 24 such as, for example, borophosphosilicate glass (BPSG). The third TEOS layer 22 and the dielectric layer 24 are used to prevent the active regions from contacting with other elements.

Subsequently, a thermal process is performed in nitrogen gas ambient about 30 minutes, at temperature 800°–875° C.

Figure 10:
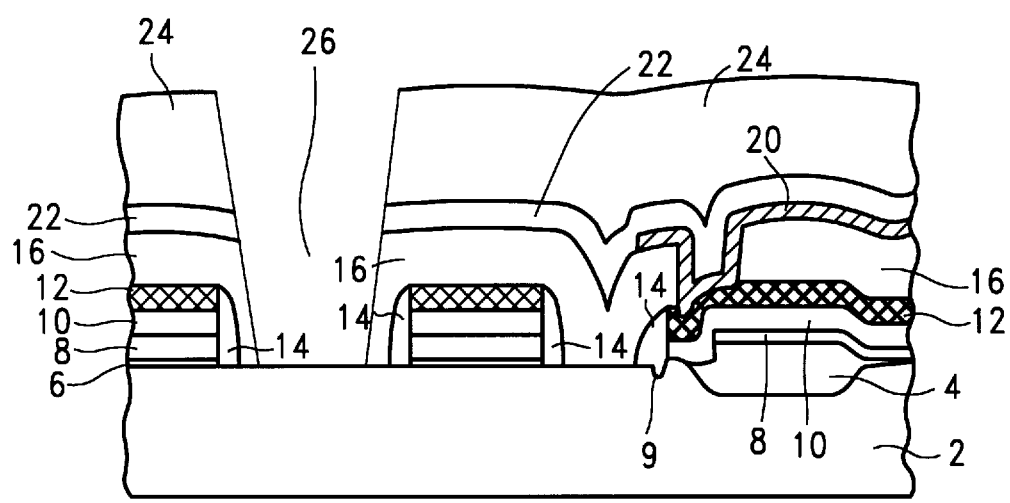
FIG. 10 is a cross sectional representation of a semiconductor wafer illustrating the step of forming a contact hole in accordance with one embodiment of the invention.

Referring to FIG. 10, standard photolithography and etching processes are used to form a contact hole 26 through the third TEOS layer 22, the dielectric layer 24 and the second TEOS layer 16. As shown in FIG. 10, the contact hole 26 is formed between the two MOSFET gate structures 15. The hole is formed by using any suitable process, such as, for example, a dry etching process. Then a contact anneal process is performed in N$_2$ ambient about 30 minutes, at temperature between a range about 600°–800° C.

Figure 11:
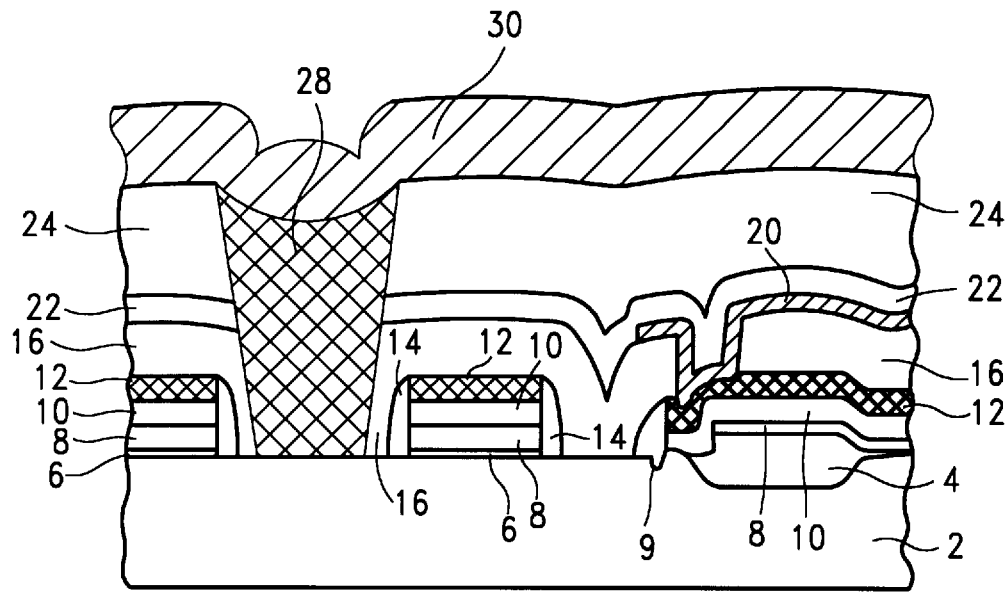
FIG. 11 is a cross sectional representation of a semiconductor wafer illustrating the step of forming a tungsten plug and a first metal layer in accordance with one embodiment of the invention.

Referring to FIG. 11, a first metal layer is formed on the BPSG layer 24. Any suitable material can be used to form the metal layer such as, for example, tungsten. Next, an etching process is utilized to etch back the tungsten layer to form a tungsten plug 28, which is used to contact the substrate 2. Then a second metal layer 30 is deposited on the plug 28. The second metal layer 30 is formed by two steps of deposition. First, a Ti/TiN composition layer is formed. The thickness of the Ti sublayer is about 400–800 angstroms thick, while the TiN sublayer is about 800–1200 angstroms thick. Then ALSiCu/TiN composition layer is subsequently formed on the first composition layer. In this embodiment, the thickness of the ALSiCu sublayer is about 4000–5000 angstroms, and the thickness of the TiN sublayer about 300–500 angstroms. A standard photolithography and an etching process are used to define metal line. The metal line is allowed to used for data bit transfer, which is DL defined in FIG. 1.

Figure 12:
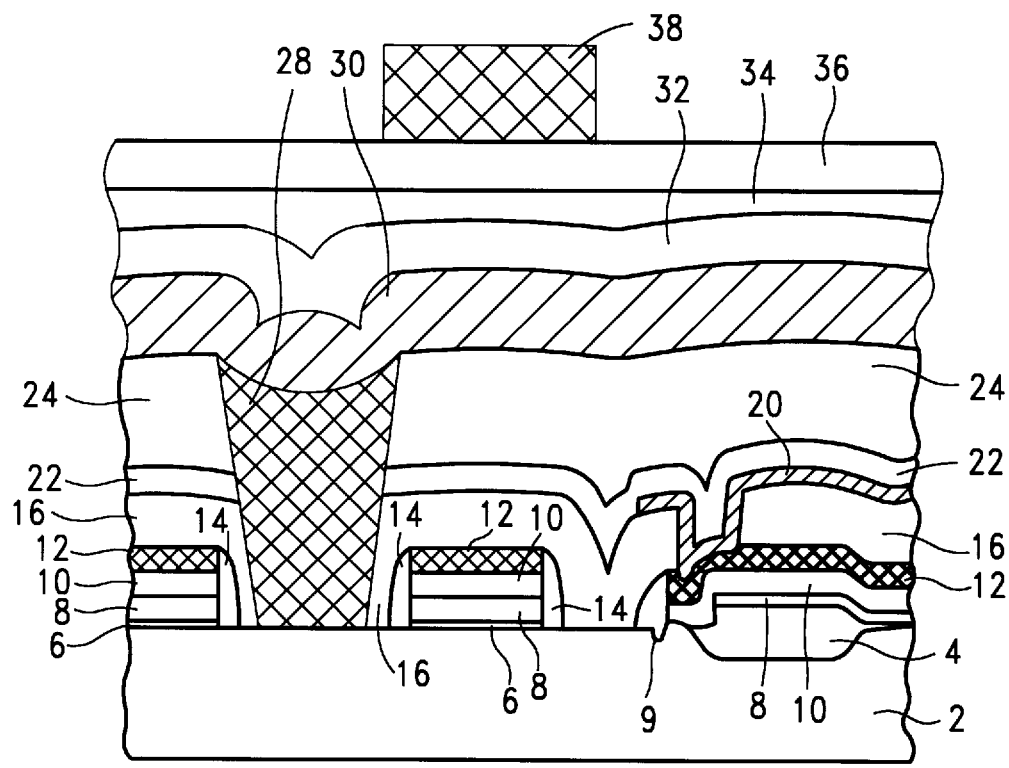
FIG. 12 is a cross sectional representation of a semiconductor wafer illustrating the step of forming a first inter metal dielectric layer, a spin on glass layer, a second inter metal dielectric layer and a second metal layer in accordance with one embodiment of the invention.

Referring to FIG. 12, a first inter metal dielectric (IMD) layer 32 is formed to have a thickness of about 3000–5000 angstroms. In this embodiment, the first IMD layer 32 is an insulated oxide layer of PE-Oxide. Then a photolithography and an etching processes are performed to form via holes through IMD layer. Subsequently, an extra thermal treatment is performed in a nitrogen gas with hydrogen gas ambient at a temperature of about 400°–450° C. for about 30–60 minutes. This thermal step is used to equalized the hydrogen concentration in the polysilicon resistor 20. The thermal step increases the diffusion of the hydrogen into and out of the polysilicon resistor 20, which causes the hydrogen concentration within the polysilicon resistor 20 to be more uniform The more uniform hydrogen concentration of the polysilicon resistor 20 causes the resistor to have a more uniform resistivity. Accordingly, the resistance of polysilicon resistors formed according to the present invention are more uniform throughout the SRAM, throughout the water, and from water-to-water. Subsequently, a third metal layer 38 is formed on the second IMD layer 36. In this embodiment, the third metal layer 38 is a Ti/AlSiCu/TiN composition layer. The thickness of the composition layer is respectively 800–1200/8000–9000/300–500 angstroms. Next, a photolithography and an etching process is performed to etch the third metal layer 38, as shown in FIG. 12. The third metal layer 38 is typically utilized to form interconnects with other elements on the same chip. The third metal layer 38 typically connects with the second metal layer 30 through a via hole for data bit transfer.

The embodiments described above are illustrative of the principles of the present invention and are not intended to limit the invention to the particular embodiments described. Accordingly, while the preferred embodiment of the invention has been illustrated and described, it will be appreciated that, in view of this disclosure, various changes can be made to form other embodiments without departing from the spirit and scope of the invention.

The embodiments of the invention in which an exclusive property or privilege is claimed are defined as follows:

1. A memory cell having a polysilicon resistor with substantially uniform resistivity, said memory cell comprising:

a polysilicon resistor formed above a semiconductor substrate; and a capping structure formed atop of said polysilicon resistor and completely covering said polysilicon resistor, wherein said capping structure is part of an interconnect structure used in implementing said memory cell, wherein said capping structure is used to prevent hydrogen penetration into said polysilicon resistor, said capping structure being formed from:
(i) a portion of a metal interconnection structure which is used for data bit transfer and a portion of a polysilicon interconnect structure; or
(ii) said polysilicon interconnect structure.

2. A static random access memory cell having a polysilicon load resistor with substantially uniform resistivity, said static random access memory cell comprising:

a polysilicon resistor formed above a semiconductor substrate; and a capping structure formed atop of said polysilicon resistor and completely covering said polysilicon resistor, wherein said capping structure is used for data bit transfer during operation of said static random access memory cell, wherein said capping structure is used to prevent hydrogen penetration into said polysilicon resistor, said capping structure being formed from:
(i) a portion of a metal interconnection structure which is used for data bit transfer and from part of a polysilicon interconnect structure; or
(ii) said polysilicon interconnect structure.

3. A static random access memory cell having a polysilicon load resistor with substantially uniform resistivity, said static random access memory cell comprising:

at least two transistors formed on a semiconductor substrate;

an isolation region separated from one of said transistors and on said semiconductor substrate;

a conductive structure consisting of a polysilicon layer over said isolation region and a metal silicide layer formed on said polysilicon layer;

a buried contact formed in said semiconductor substrate and adjacent to said conductive structure;

a first isolation layer formed on said at least two transistors and on said conductive structure, wherein said first isolation layer having a contact hole for connecting to said conductive structure;

a polysilicon resistor formed along a surface of said contact hole, and said polysilicon resistor contacting said conductive structure;

at least one second isolation layer formed on said polysilicon resistor and said transistors; and a capping structure formed atop of said second isolation layer and said polysilicon resistor and completely covering said polysilicon resistor, wherein said capping structure is part of a polysilicon interconnect structure.

4. A static random access memory cell having a polysilicon load resistor with substantially uniform resistivity, said static random access memory cell comprising:

at least two transistors formed on a semiconductor substrate;

an isolation region separated from one of said transistors and on said semiconductor substrate;

a conductive structure consisting of a polysilicon layer over said isolation region and a metal silicide layer formed on said polysilicon layer;

a buried contact formed in said semiconductor substrate and adjacent to said conductive structure;

a first isolation layer formed on said at least two transistors and on said conductive structure, wherein said first isolation layer having a contact hole for connecting to said conductive structure;

a polysilicon resistor formed along a surface of said contact hole, and said polysilicon resistor contacting said conductive structure;

at least one second isolation layer formed on said polysilicon resistor and said transistors; and a capping structure formed atop of said second isolation layer and said polysilicon resistor and completely covering said polysilicon resistor, wherein said capping structure comprises a portion of a metal interconnect structure and a portion of a polysilicon interconnect structure.

* * * * *